(12) United States Patent
Chen et al.

(10) Patent No.: US 9,471,179 B2
(45) Date of Patent: Oct. 18, 2016

(54) LASER OPTICAL TOUCH CONTROL MODULE ANALOG-TO-DIGITAL CONVERSION SYSTEM AND METHOD OF THE SAME

(75) Inventors: Guo-Zen Chen, New Taipei (TW); Ming-Hua Wen, New Taipei (TW); Shun-Cheng Lin, New Taipei (TW)

(73) Assignee: SERAFIM TECHNOLOGIES INC., New Taipei (TW)

( * ) Notice: Subject to any disclaimer, the term of this patent is extended or adjusted under 35 U.S.C. 154(b) by 678 days.

(21) Appl. No.: 13/818,065

(22) PCT Filed: Dec. 17, 2010

(86) PCT No.: PCT/CN2010/002079
§ 371 (c)(1),
(2), (4) Date: Feb. 20, 2013

(87) PCT Pub. No.: WO2012/022018
PCT Pub. Date: Feb. 23, 2012

(65) Prior Publication Data
US 2013/0147766 A1    Jun. 13, 2013

(30) Foreign Application Priority Data

Aug. 20, 2010  (CN) .......................... 2010 1 0258264
Oct. 27, 2010  (CN) .......................... 2010 1 0525510

(51) Int. Cl.
| | |
|---|---|
| G06F 3/042 | (2006.01) |
| H03M 1/34 | (2006.01) |
| H03M 1/12 | (2006.01) |
| G06F 3/041 | (2006.01) |

(52) U.S. Cl.
CPC ............. *G06F 3/042* (2013.01); *G06F 3/0416* (2013.01); *G06F 3/0421* (2013.01); *H03M 1/129* (2013.01); *H03M 1/34* (2013.01)

(58) Field of Classification Search
None
See application file for complete search history.

(56) References Cited

U.S. PATENT DOCUMENTS

| | | | | |
|---|---|---|---|---|
| 4,553,842 A | * | 11/1985 | Griffin | .......................... 356/621 |
| 4,839,739 A | | 6/1989 | Tachiuchi et al. | |
| 6,353,405 B1 | | 3/2002 | Yang et al. | |
| 7,538,759 B2 | | 5/2009 | Newton | |
| 7,629,967 B2 | | 12/2009 | Newton | |
| 7,692,625 B2 | | 4/2010 | Morrison et al. | |

(Continued)

FOREIGN PATENT DOCUMENTS

| | | |
|---|---|---|
| CN | 1629620 A | 6/2005 |
| CN | 2824143 Y | 10/2006 |
| CN | 101033937 A | 9/2007 |
| CN | 101315287 A | 12/2008 |
| CN | 201218936 Y | 4/2009 |
| CN | 101644976 A | 2/2010 |
| CN | 201489499 U | 5/2010 |

*Primary Examiner* — David D Davis
(74) *Attorney, Agent, or Firm* — Muncy, Geissler, Olds & Lowe, P.C.

(57) ABSTRACT

A laser optical touch control module includes a light emitting part with a laser light source and a light receiving part with a position sensor. A laser beam is emitted from the laser light source and reflected by a wide angle optical element. Thus a light fan of the reflected light is larger than 90 degrees to form a wide angle linear light beam. The position of a touch control widget is obtained by a sensor of the light receiving part that detects the linear light beam blocked and reflected by the touch control widget. An analog-to-digital conversion system includes a variable reference level generator that calculates to generate a variable reference level according to different variances. Then the sensor output data is converted into a digital signal based on the reference voltage level by a digital comparator and the digital signal is output to a processor.

14 Claims, 12 Drawing Sheets

(56) References Cited

U.S. PATENT DOCUMENTS

| | | |
|---|---|---|
| 8,896,576 B2* | 11/2014 | Miyazaki et al. ............ 345/175 |
| 2003/0001825 A1* | 1/2003 | Omura et al. ................ 345/173 |
| 2005/0243070 A1* | 11/2005 | Ung et al. .................... 345/176 |
| 2009/0190944 A1 | 7/2009 | Okada |
| 2009/0200453 A1 | 8/2009 | Lieberman et al. |
| 2009/0237376 A1* | 9/2009 | Bridger ........................ 345/175 |
| 2010/0097348 A1* | 4/2010 | Park et al. .................... 345/175 |
| 2010/0171853 A1 | 7/2010 | Kondo |
| 2011/0316776 A1* | 12/2011 | Ong et al. ..................... 345/158 |

* cited by examiner

LASER OPTICAL TOUCH CONTROL MODULE ANALOG-TO-DIGITAL CONVERSION SYSTEM AND METHOD OF THE SAME

BACKGROUND OF THE INVENTION

The present invention relates to a laser optical touch control module, an analog-to-digital conversion system and a method of the same, especially to the laser optical touch control module formed by a light emitting part with a laser light source and a light receiving part with a position sensor. Light paths of the light emitting part and the light receiving part are in parallel or share the same light path with each other. A variable reference level generator calculates to generate a variable reference level according to a peak value of output signal of the position sensor, and/or a reference voltage level (VB), and/or a variance of temperature, light source intensity, ambient light intensity etc. Then the output data of the sensor is effectively and quickly converted into a digital signal base on the variable reference level by a level comparator and the digital signal is output.

Instead of buttons used for control of general monitors, various functions of touch control displays most popular now such as pointing and selecting, image switching, or zoom out/in, etc are performed through a touch control widget such as fingers or touch control pen directly in contact with surface of the display. The touch control displays available now include many different systems such as resistive type, capacitive type, Surface Acoustic Wave (SAw) type, Infrared (IR) type, optical imaging type, etc. Each has its own advantages and shortcomings. For example, the optical imaging type can be applied to large-scale displays with cost-effectiveness between SAW type and capacitive type. The display has good transparency (up to 100%) and good resolution. The shortcomings include no applications to small-size panel (<15"). Moreover, it's easy to be affected by ambient light so that additional light sources, and reflective strips or light absorbing strips are required.

Refer to US Pat. App. Pub. No. 2009/0200453, U.S. Pat. Nos. 7,538,759, 7,692,625, 7,629,967, these are techniques available now related to optical touch control systems. Generally, at least one set light source such as LED light source is disposed on four edges or corners on surface of a rectangular display so as to light outer surface of the whole display. Moreover, four edges (frame) on surface of the display are arranged with reflective strips or light absorbing strips perpendicular to one another. At least two sets of position sensors (such as camera) with crossed sensing directions are disposed on edges on surface of the display. When a touch control device such as finger or touch control pen is in contact with surface of the display, the touch control device blocks light emitted to surface of the whole display or causes the light scattered. Through reflection of the reflective strips or absorption of the light absorbing strips, at least two sets of position sensors sensing position of the touch control device, one processing circuit with calculation function, the coordinate of the actual position of the touch control device on surface of the display is obtained. The functions of the optical touch control system are provided.

Most of optical touch control systems available now use LED (light-emitting diode) as light source. Yet LED light is not highly coherent light and the sensitivity of touch control is unable to be increased effectively. Moreover, the LED light source and the position sensor such as camera are separated from each other and used together with reflective strips or light absorbing strips set on certain positions around surface of the display. Thus the structure is complicated and the cost is high. Especially the light provided by the LED light source is usually visible light, it's easy to be interfered or affected by ambient visible light. Thus detection sensitivity of the position sensor of the optical touch control system is reduced. That means signal/noise ratio (SNR) is reduced and signal interpretation is further affected. Therefore efficiency of the optical touch control system is reduced.

Refer to FIG. 1, FIG. 1A, FIG. 8 and FIG. 8A, at least one light source 11 (10) such as LED or laser is arranged at four corners or four sides of a frame on surface of a rectangular display 2 so as to light surface of the whole display. That means a light or linear light emitted area (so-called light screen) is formed on surface of the display 2. Moreover, reflective strips or light absorbing strips perpendicular to one another (not shown in figure) are disposed around the edges on surface of a display 2. At least two sets of position (image) sensor 21 (there is only one in figure) with crossed sensing directions are set on edges around surface of the display 2. When a touch control device 3 such as finger or touch control pan touches surface of the display, the touch control device 3 causes scattering of light emitted on surface of the whole display 2 (reflective type as shown in FIG. 1) or blocks the light (photo interrupter type as shown in FIG. 8). Now through reflection of the reflective strips or absorption of the light absorbing strips, the reflective or blocked laser beam due to the touch control device 3 as shown in FIG. 1 and FIG. 8 acts on an axis of active pixels of the position (image) sensor 21 to for a signal output/sensor output data, represented by Vout as shown in FIG. 1A and FIG. 8A.

A relative position of the touch control device 3 in least two directions is detected by at least two sets of position sensors. Then through one processor or processing circuit with calculation function, the coordinate of the actual position of the touch control device 3 on surface of the display 2 is obtained. The functions of the optical touch control system are provided. Moreover, the sensor output data Vout from the position (image) sensor 21 shown in FIG. 1A and FIG. 8A is analog data. The analog data should be converted into digital data first so as to be processed by a processor such as MCU (Micro Control Unit), CPU (Central Processing Unit) or DSP (Digital Signal Processing), but not limited to the above processors for obtaining the coordinate of the actual position of the touch control device 3 on surface of the display 2.

However, the conversion of the sensor output data Vout into digital data mentioned above is usually performed by an analog-to-digital conversion (ADC) circuit, as prior arts revealed in U.S. Pat. No. 4,839,739, US Pub. No. US2009/0190944 and US2010/0171853. But the installation cost of the ADC circuit is quite high and the ADC circuit also increases loading of the processor. Thus the program efficiency is reduced. Moreover, the operation conditions of the optical touch control system in use always changes along with the environment outside and component properties. This is called variance such as sensor element variance, temperature variance, light source intensity variance, ambient light intensity variance, etc. This lead to upward or downward variation of basic voltage level of the sensor output data Vout from the position (image) sensor 21. For example, the changes of the sensor output data Vout from a solid line to a dotted line shown in FIG. 1A and FIG. 8A increase the loading of the processor and reduce the program efficiency. The above shortcomings have negative effects on development and prevalence of the analog-to-digital conversion circuit system with the position (image) sensor signal or the optical touch control system.

Thus there is room for improvement in the fields of optical touch control system and the analog-to-digital conversion circuit system with the position (image) sensor signal and a need to develop a new optical touch control system and a novel analog-to-digital conversion circuit system. The new optical touch control system has simple structure, reduced cost but having no reflective strips/or or light absorbing strips while the novel analog-to-digital conversion circuit system has reduced cost, less loading of the processor program, and increased program efficiency but without the use of ADC circuit.

SUMMARY OF THE INVENTION

Therefore it is a primary object of the present invention to provide a laser optical touch control module that consists of a light emitting part with a laser light source such as infrared laser and a light receiving part with a position sensor. The laser light source and the position sensor are disposed on the same side on surface of a display. A laser beam is emitted from the laser light source and then is reflected by a wide angle optical element such as line generator optics. The light fan of the reflected light beam is larger than 90 degrees so as to form a wide angle linear light beam on surface of the display. The linear light beam is blocked by a touch control widget to form a reflected laser beam and the light receiving part receives and senses the reflected laser beam by a position sensor so as to get the position of the touch control widget. The sensitivity of control touch is increased due to high coherence of the laser beam. Moreover, the inconvenience of the techniques available now such as arrangement of reflective strips or light absorbing strip can be avoided. Thus the present invention has simple structure and high touch control sensitivity.

It is another object of the present invention to provide a laser optical touch control module that in which a light path of the light emitting part and a light path of the light receiving part are arranged horizontally and in parallel with each other. Thus the sensitivity of touch control is enhanced due to high coherence of the laser beam. Moreover, the structure is simplified and the assembly is easy.

It is another object of the present invention to provide a laser optical touch control module that in which a light path of the light emitting part and a light path of the light receiving part share the same light path. Thus the laser light source of the light emitting part such and the position sensor of the light receiving part use the same wide angle optical element such as line generator optics. That means both a laser beam from the laser light source and a reflected light beam received and sensed by the position sensor pass through the same wide angle optical element. Moreover, a beam splitter is arranged at rear of the wide angle optical element. Thus the laser beam from the laser light source passes through the beam splitter to be emitted and the reflected laser beam is reflected by the beam splitter to be received and sensed by the position sensor. Thus the wide angle optical element originally required by the position sensor such as a wide angle imaging lens (whose viewing angle is larger than 90 degrees) can be saved. And the optical aberration (optical distortion on the periphery or edge) can be avoided. A sensing surface of the position sensor is further arranged with a micro lens, like a commercial CMOS sensor, to increase light collection capability and efficiency.

It is a further object of the present invention to provide a laser optical touch control module in which the laser light source is a small-diameter light source for improving light scattering efficiency of the wide angle optical element such as line generator optics when the light path of the light emitting part and the light path of the light receiving part share the same light path. A beam expander is set on a front end of the sensing surface of the position sensor, between the position sensor and the beam splitter. Thus a small-diameter laser beam is expanded into the laser beam with larger diameter to be emitted into the sensing surface of the position sensor for using pixels on the position sensor effectively and further improving resolution of touch control.

It is a further object of the present invention to provide a laser optical touch control module in which a quarter-wave plate and a polarization beam splitter are arranged in turn on rear side of the wide angle optical element such as line generator optics. A laser beam emitted from the laser light source has two orthogonal linear polarization components-P-polarization and S-polarization. While passing through the polarization beam splitter, one polarization component (generally the P-polarization) completely passes through while the other polarization component perpendicular to the previous one (generally the S-polarization) is reflected completely. Then by the quarter-wave plate, the passed polarization is converted into a circular polarization (left hand circular polarization or right hand circular polarization). If the polarization is converted into left hand (or right hand) circular polarization to be emitted outward, the light is changed into right hand circular polarization (or left hand) after being blocked and reflected by the touch control widget. The reflected light is firstly passed through the quarter-wave plate to be converted into the polarization component perpendicular to the original polarization component, and then entering the polarization beam splitter to be totally reflected onto the position sensor. Therefore the light efficiency is improved. That means the use efficiency of the laser light energy is maximized.

It is a further object of the present invention to provide an analog-to-digital conversion system and a method thereof that effectively converts analog/sensor output data (signal output/sensor data, Vout) detected by a position (image) sensor of a laser optical touch control module into a digital signal to be processed by a processor. A digital comparator is used to replace conventional analog-to-digital conversion (ADC) circuit. A variable reference level generator is for generating a variable reference level VREF according to peak value VA obtained by the sensor output data Vout being detected by, at least one detection circuit. Then the sensor output data Vout is effectively and quickly converted into a digital signal by the digital comparator based on the variable reference level VREF. The digital signal is output to a processor. Thus the cost is reduced without the use of the ADC, the loading of the processor program is reduced and the program efficiency is improved.

It is a further object of the present invention to provide an analog-to-digital conversion system and a method thereof in which a variable reference level generator calculates to generate a variable reference level VREF according to a peak value (VA) and a reference voltage level (VB). The peak value (VA) is obtained by the sensor output data (Vout) being detected by at least one detection circuit while the reference voltage level (VB) is a part of the voltage level of the sensor output data (Vout) except the peak value (VA). For example, VREF=(VA+VB)/2. Then the sensor output data Vout is compared and converted into a digital signal by the digital comparator based on the variable reference level VREF and the digital signal is output to the processor.

It is a further object of the present invention to provide an analog-to-digital conversion system and a method thereof in which the variable reference level generator calculates to generate the variable reference level VREF according to a peak value (VA) obtained by analog sensor output signal Vout being detected by at least one detection circuit, and/or a reference voltage level (VB), and/or a temperature variance (VC) obtained by temperature detection, and/or a light source intensity variance (VD) obtained by detection of light source intensity, and/or an ambient light intensity variance (VE) obtained by detection of ambient light intensity. Thus the system has advantages of sensor variation resistance, and/or temperature variation resistance, and/or light source intensity variation resistance, and/or ambient light intensity variation resistance. Moreover, there is no need to adjust reference voltage level during manufacturing.

It is a further object of the present invention to provide an analog-to-digital conversion system and a method thereof in which the variable reference level VREF generated by calculation of the variable reference level generator is further set into a staged reference level. Thus the digital comparator selects a proper reference level (VREF) of the staged reference level according to the sensor output data (Vout) and the proper reference level is used as a base so as to convert the sensor output data (Vout) effectively and quickly into a digital signal. Then the digital signal is output to the processor. Thereby the variable reference level VREF originally not staged or unable to be staged is changed to be a staged variable reference level. The interval between values among each stage of the reference level is increased. Thus application range of each stage of the reference level is broadened, the loading of the processor program is reduced and the program efficiency is improved It is a further object of the present invention to provide an analog-to-digital conversion system and a method thereof in which analog sensor output data obtained by at least one position (image) sensor of a laser optical touch control module is effectively converted into a digital signal that is processed by a processor. A processing method of the analog-to-digital conversion system includes following steps:

providing a digital comparator;

detecting peak value VA of sensor output data Vout by at least one detection circuit;

providing a variable reference level VREF according to the sensor output data Vout and the peak value VA; and converting the peak value VA of the sensor output data Vout into a digital signal based on the variable reference level VREF by the digital comparator and outputting the digital signal;

A variable reference level generator with calculation function is provided to generate a variable reference level VREF according to the peak value VA.

The variable reference level generator can further calculate to generate the variable reference level VREF according to the peak value VA and/or a reference voltage level (VB), and/or a variance obtained by temperature detection (VC), and/or a variance obtained by detection of light source intensity (VD), and/or a variance obtained by detection of ambient light intensity (VE).

The variable reference level VREF generated by calculation of the variable reference level generator is set as a staged reference level.

DETAILED DESCRIPTION OF THE PREFERRED EMBODIMENT

Figure 1:
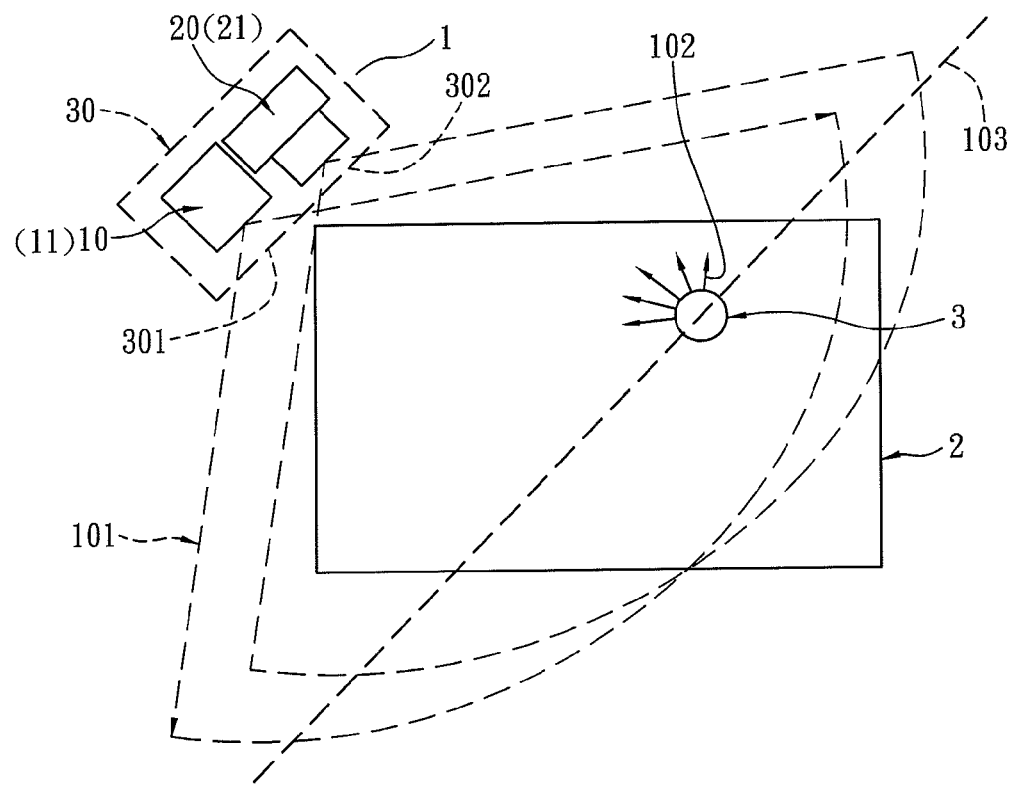
FIG. 1 is a schematic drawing showing an embodiment disposed on one side of a surface of a display with parallel light paths and providing reflective positioning input function according to the present invention.
Figure 1A:
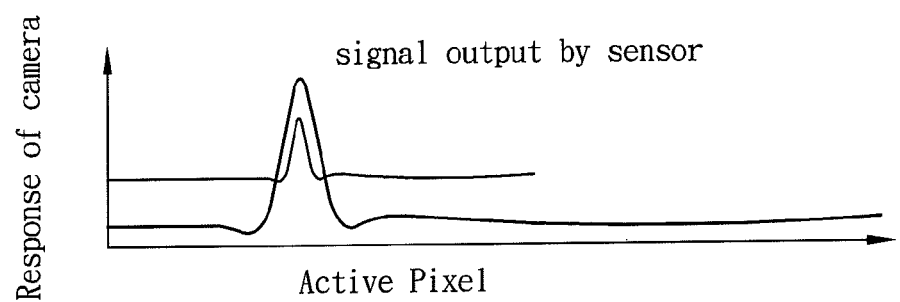
FIG. 1A is a schematic drawing showing sensing signal output of active pixels of a position sensor of the embodiment in FIG. 1 according to the present invention.

Refer to FIG. 1 and FIG. 1A, a laser optical touch module 1 of the present invention is disposed on one side of a surface of a display 2 and is used for optical positioning input function so as to form an optical touch module system on the display 2. Generally, at least two 1 are arranged at a peripheral of the surface of the display 2. For example, each of two adjacent corners on an edge of the display 2 is disposed with a laser optical touch module 1. The laser optical touch module 1 includes position sensors whose sensing directions are crossed on surface of the display. FIG. 1 shows the laser optical touch module 1 in use.

The laser optical touch module 1 includes a light emitting part 10 and a light receiving part 20, both mounted in a housing 30. The shape of the housing 30 is not limited. The housing 30 is disposed with a light emitting opening 301 and a light receiving opening 302 respectively corresponding to optical path of the light emitting part and optical path of the light receiving part 20. The light emitting part 10 emits light mainly by a laser light source 11 that emits a laser beam. After being reflected by a wide angle optical element 12 such as line generator optics, light fan of the laser beam is larger than 90 degrees, as shown in FIG. 1. Thus a wide angle linear light beam 101 is formed on surface of the display 2. When a touch control widget 3 touches the surface of the display 2, the linear light beam 101 is blocked to form a reflected laser beam 102. The light receiving part 20 receives and senses the reflected laser beam 102 by a position sensor 21. The position of the touch control widget 3 in relative to a corresponding optical axis 103 is learned by the position sensor 21 detecting a sensing surface. As shown in FIG. 1A, the reflected laser beam 102 caused by the touch control widget 3 will react on an axis of active pixel of the position sensor 21 to form a signal output. The signal passes through at least two sets of position sensors 21 so as to sense and learn relative positions of the touch control widget 3 in at least two directions. Then the coordinate of the actual position of the touch control widget 3 on surface of the display 2 is obtained through operation of the processing circuit. The function of the position sensor 21, the wide angle optical element 12 such as line generator optics or the operation of the processing circuit all can be achieved by electronic techniques available now.

Figure 2:
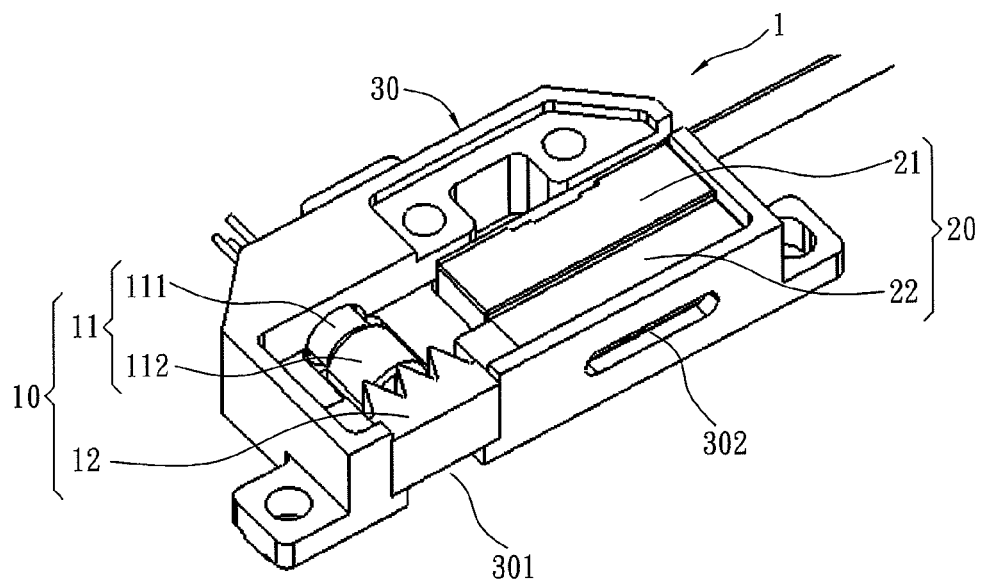
FIG. 2 is a perspective view of an embodiment with parallel light paths according to the present invention.
Figure 3:
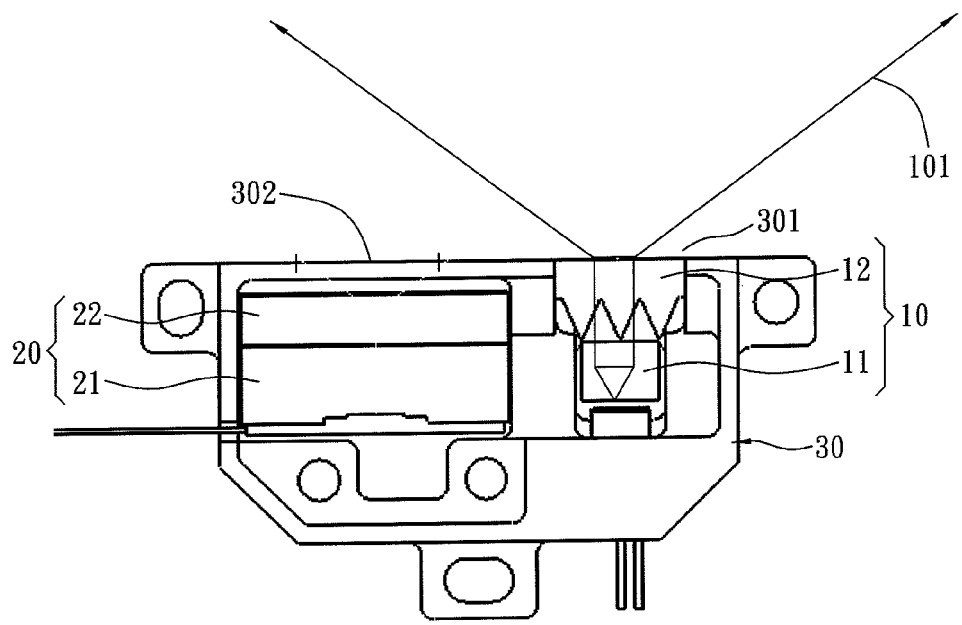
FIG. 3 is a top view of the embodiment in FIG. 2 according to the present invention.

Refer to FIG. 2 and FIG. 3, an embodiment with parallel light is revealed, but not intended to limit the scope of the present invention. The laser optical touch module 1 is composed of a light emitting part 10 with a laser light source 11 such as infrared laser and a light receiving part 20 with a position sensor 21. The laser light source 11 and the position sensor 21 are disposed on the same side on surface of the display 2. The laser light source 11 of the light emitting part 10 consists of a laser diode 111 and a primary optics (1st optics) 112. A laser beam is emitted from the laser light source 11 and then is reflected by a wide angle optical element 12 such as line generator optics. The light fan of the reflected light beam is larger than 90 degrees (as shown in FIG. 3) so as to form a wide angle linear light beam 101 on surface of the display 2, as shown in FIG. 1 and FIG. 3. As, shown in FIG. 1, a laser beam formed due to the linear light beam 101 being blocked and reflected by a touch control widget 3 is received and sensed by a position sensor 21 and a collective optical element 22 so as to learn the relative position of the touch control widget 3. Due to high coherence of the laser beam, the sensitivity of control touch of the laser optical touch module 1 of the present invention is increased. Moreover, the inconvenience of the techniques available now such as arrangement of reflective strips or light absorbing strips can be avoided. Thus the present invention has simple structure, easy assembly and high touch control sensitivity.

Still refer to FIG. 2 and FIG. 3, the light emitting part 10 and the light receiving part 20 form a module. The laser optical touch module 1 of the above embodiment is formed by the module mounted in the housing 30. The housing is disposed with a light emitting opening 301 corresponding to a light path of the light emitting part 10 and a light receiving opening 302 corresponding to a light path of the light receiving part 20, as shown in FIG. 1 and FIG. 2. The light path of the light emitting part 10 and the light path of the light receiving part 20/the light emitting opening 301 and the light receiving opening 302 are arranged parallel to each other. In this embodiment, the light path of the light emitting part 10 and the light path of the light receiving part 20 are, but not limited to, arranged transversely and parallel to each other (horizontal to the surface of the display 2). Or the light path of the light emitting part 10 and the light path of the light receiving part 20 can also be disposed parallel and vertically to each other (perpendicular to the surface of the display 2)(not shown in figure).

Figures 4, 5:
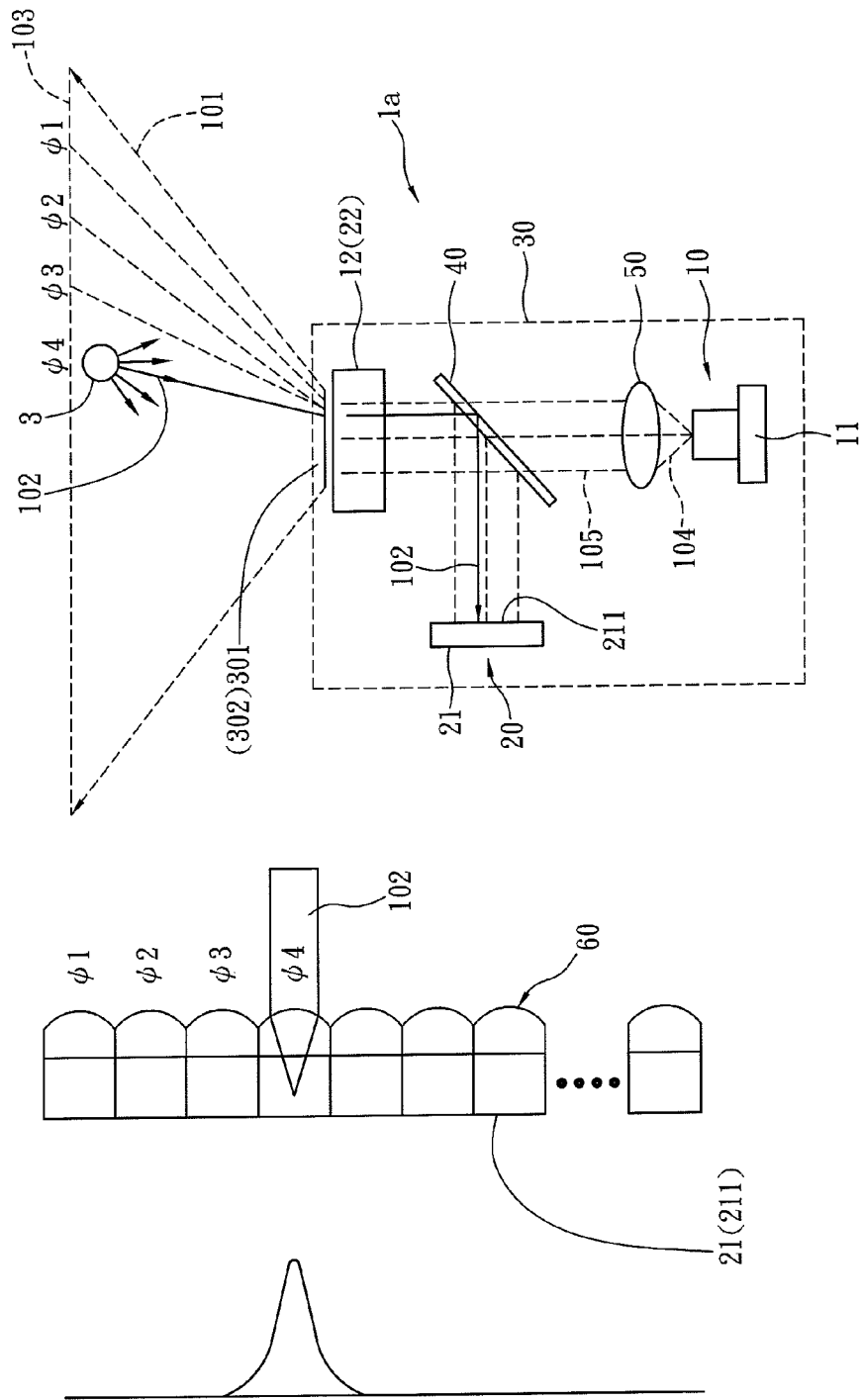
FIG. 4 is a schematic drawing showing another embodiment with parallel light paths according to the present invention.
FIG. 5 is a schematic drawing showing a micro lens arranged at a sensing surface of a position sensor of an embodiment according to the present invention.

Refer to FIG. 4, another embodiment is revealed. A laser optical touch module 1a of this embodiment is a module formed by a light emitting part 10 and a light receiving part 20. The light emitting part 10 and the light receiving part 20 are mounted in a housing 30. In this embodiment, the light path of the light emitting part 10 and the light path of the light receiving part 20 are the same light path. That means the laser light source 11 and the position sensor 21 share the same light path. Thus an opening for light path of the light emitting part 10 and an opening for light path of the light receiving part 20, like the light emitting opening 301 and the light receiving opening 302 form the same opening 301 (302) on the housing 30 for allowing the light path of the laser light source 11 and the position sensor 21 to pass through. Moreover, due to the common light path, the laser light source 11 of the light emitting part 10 and the position sensor 21 of the light receiving part 20 share the same wide angle optical element 12 (22) such as line generator optics. That means a laser beam 101 emitted from the laser light source 11 and the reflected laser beam 102 received and sensed by the position sensor 21 both pass the same wide angle optical element 12 (22). And the reverse light path of the line generator optics generates a light concentration effect, like a wide angle imaging lens (whose viewing angle is larger than 90 degrees). A beam splitter 40 is disposed on rear of the wide angle optical element 12 (22) so as to make the laser beam 101 from the laser light source 11 pass through the beam splitter 40 to be emitted to the wide angle optical element 12 (22). Moreover, the reflected laser beam 102 passing through the wide angle optical element 12 (22) and entering the beam splitter 40 is reflected by the beam splitter 40 to be received and sensed by the position sensor 21. In this embodiment, the wide angle optical element 22 required for the position sensor 21 is saved due to the common light path structure. The reverse light path of the line generator optics works like a wide angle imaging lens whose viewing angle is larger than 90 degrees and the optical aberration (optical distortion on the periphery or edge) of the wide angle optical element 22 can be reduced. Moreover, a collimator 50 is further arranged between the laser light source 11 and the beam splitter 40 to make a laser beam 104 emitted from the laser light source 11 form a parallel light beam 105 after passing through the collimator 50. This is beneficial to form the wide angle linear light beam on surface of the display while the light beam 105 further passing through the wide angle optical element 12 (22) such as line generator optics.

Refer to FIG. 4 and FIG. 5, a sensing surface 211 of the position sensor 21 is further disposed with a micro lens 60 that works like a commercial complementary metal-oxidesemiconductor (CMOS). Thus the laser beam 102 formed by the touch control widget 3 touching the position Φ4 among positions Φ1~ΦN on the optical axis 103 correspondingly can be concentrated on a corresponding active pixel #4 among active pixels #1 ~#N on the sensing surface 211 for increasing light collection capability and efficiency.

Figure 6:
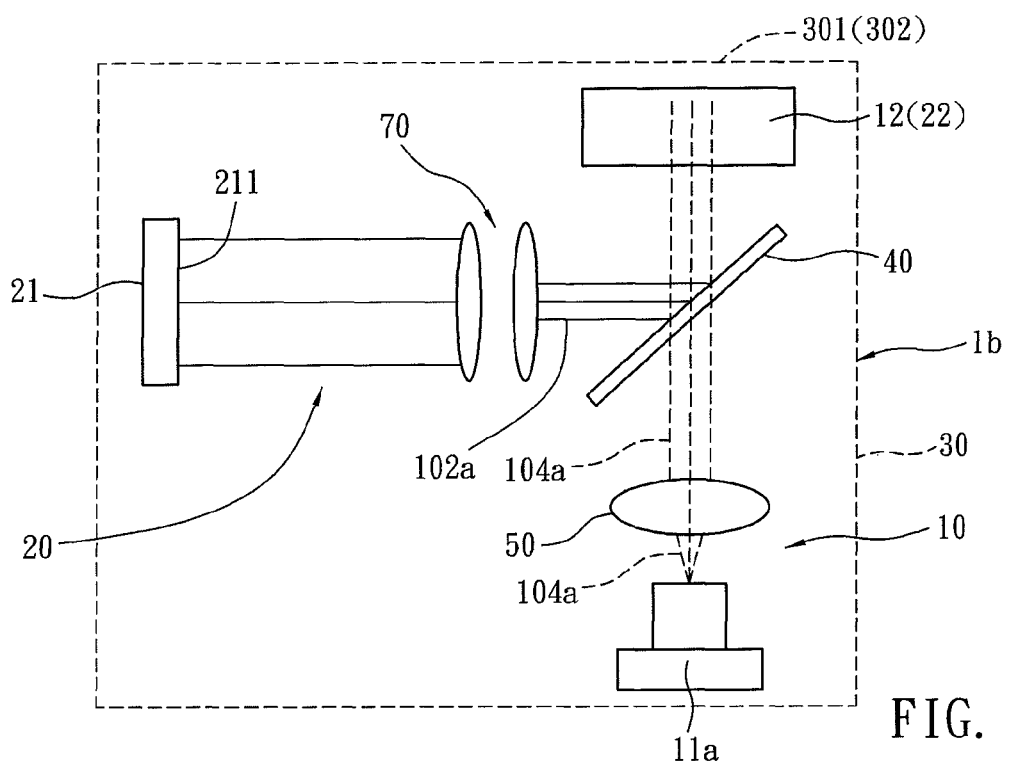
FIG. 6 is a schematic drawing showing a further embodiment with a common light path according to the present invention.

Refer to FIG. 6, a laser optical touch module 1b of a further embodiment is revealed. The laser optical touch module 1b of this embodiment has similar structure to the laser optical touch module 1a of the embodiment shown in FIG. 5. The difference between these two embodiments is in that: this embodiment includes a laser light source 11a that emits a small-diameter laser beam 104a for improving light scattering efficiency of the wide angle optical element 12 (22) such as line generator optics. Moreover, a beam expander 70 is set on a front end of the sensing surface 211 of the position sensor 21, between the position sensor 21 and the beam splitter 40. The beam expander is for expanding a small-diameter reflected laser beam 102a into the laser beam with larger diameter to be emitted into the sensing surface 211 of the position sensor 21 so as to use pixels on the position sensor 21 effectively and further improve resolution of touch control.

Figure 7:
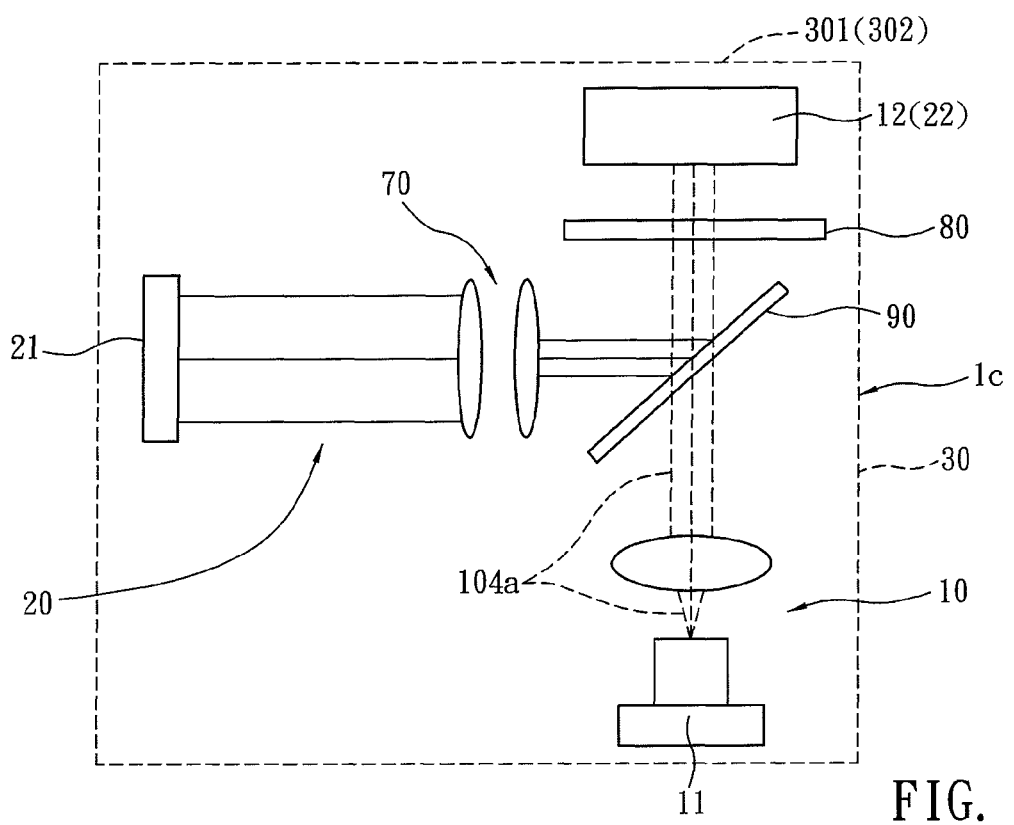
FIG. 7 is a schematic drawing showing a further embodiment with a common light path according to the present invention.

Refer to FIG. 7, a further embodiment is disclosed. A laser optical touch module 1c of this embodiment has similar structure to the laser optical touch module 1b of the embodiment shown in FIG. 6 and the difference is in that: this embodiment includes a quarter-wave plate 80 and a polarization beam splitter 90 arranged in turn on rear side of the wide angle optical element 12 (22) instead of the beam splitter 40 in the laser optical touch module 1b of the above embodiment. A laser beam 104a emitted from a laser light source 11 includes two orthogonal linear polarization components-P-polarization and S-polarization. While in use and the laser beam 104a passing through the polarization beam splitter 90, one polarization component (generally the P-polarization) completely passes through while the other polarization component perpendicular to the previous one (generally the S-polarization) is reflected completely. Then by the quarter-wave plate 80, the passed polarization is converted into a circular polarization (left hand circular polarization or right hand circular polarization). If the polarization is converted into left hand (or right hand) circular polarization to be emitted outward, the light is changed into right hand circular polarization (or left hand) after being blocked and reflected by the touch control widget. The reflected light is firstly passed through the quarter-wave plate to be converted into the linear polarization perpendicular to the original linear polarization, and then entering the polarization beam splitter to be totally reflected onto the position sensor 21. Thereby the efficiency of the light is increased. That means the use efficiency of the laser light energy is maximized.

Refer to FIG. 1, FIG. 1A, FIG. 8 and FIG. 8A, sensor output data Vout obtained by the position sensor 21 is an analog data that needs to be converted to digital data first for processor operation. Generally, an analog-to-digital conversion (ADC) circuit is used for converting the above analog sensor output data Vout into digital data. However, the ADC circuit has shortcomings of high installation cost, increased loading of the processor, reduce program execution efficiency, etc.

Figure 9:
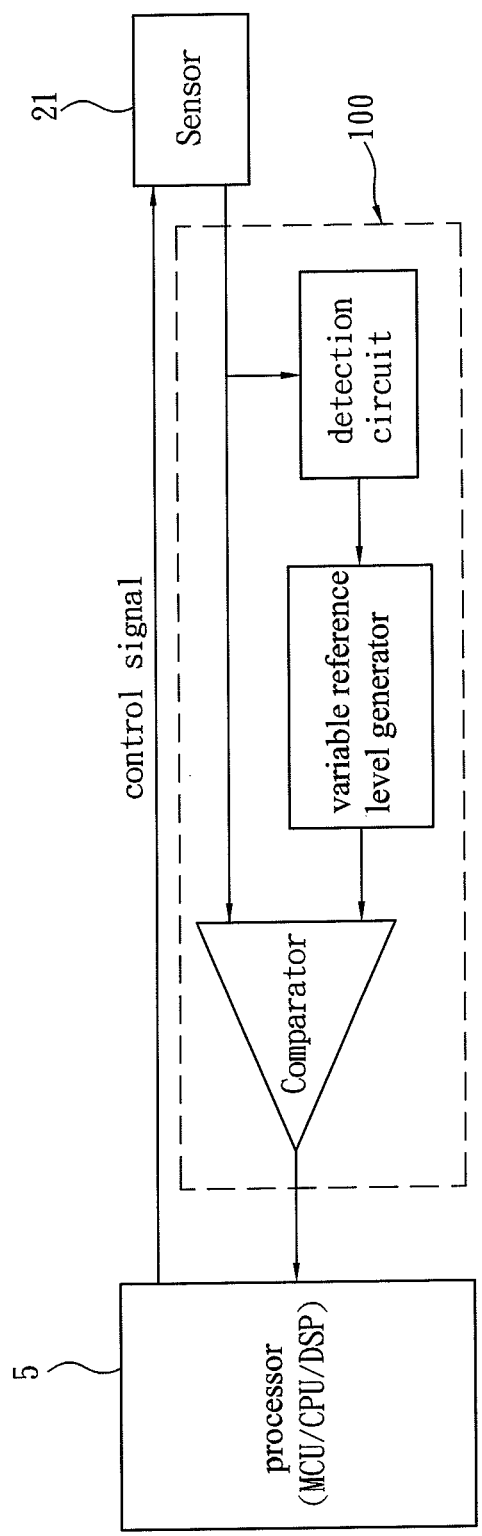
FIG. 9 is a block diagram showing an analog-to-digital conversion system in use according to the present invention.
Figures 10, 11:
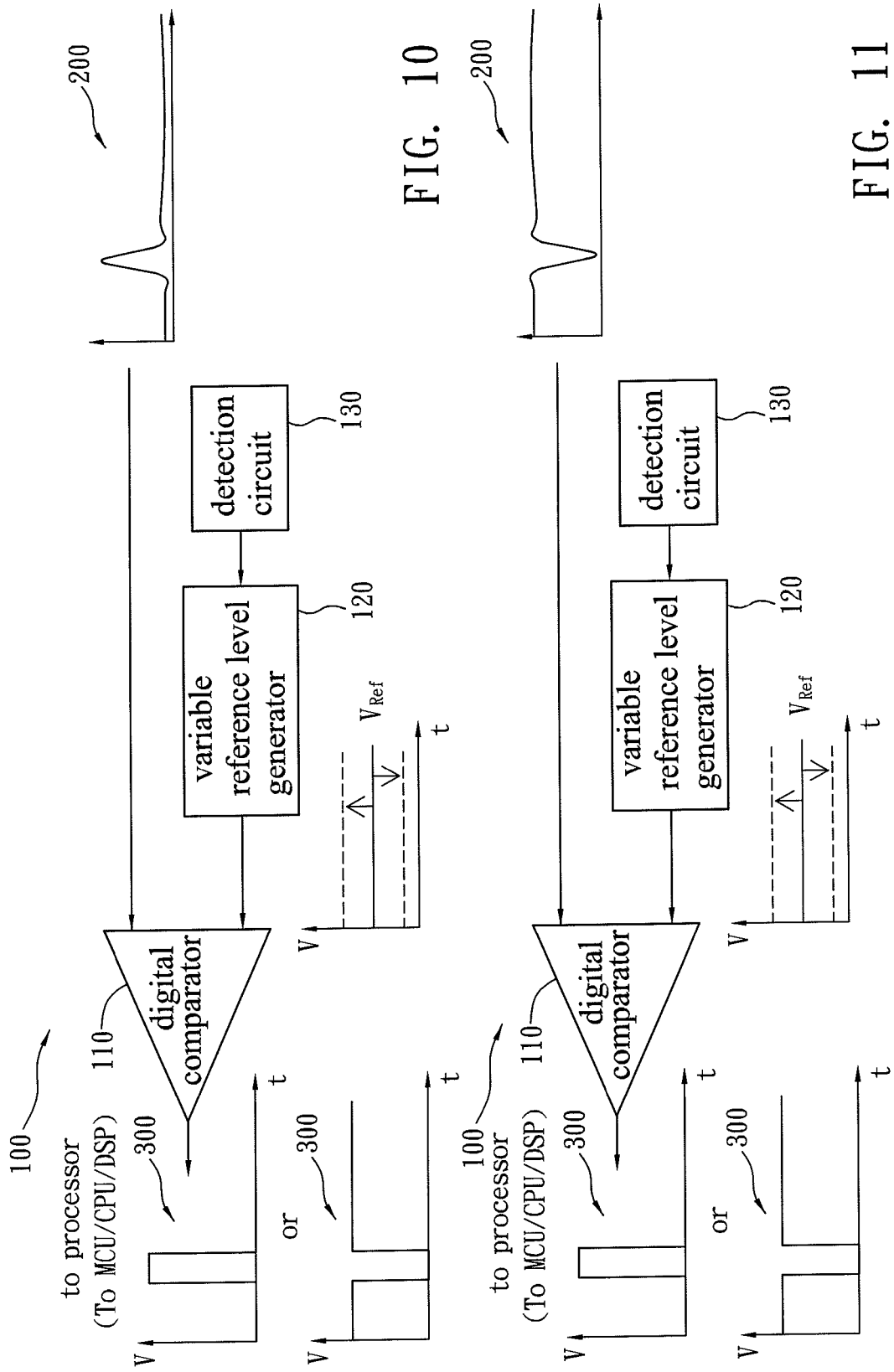
FIG. 10 is a block diagram showing function of an analog-to-digital conversion system applied to a reflective touch control system according to the present invention.
FIG. 11 is a block diagram showing function of an analog-to-digital conversion system applied to a photo interrupter type touch control system according to the present invention.

Refer to FIG. 9, an analog-to-digital conversion system 100 of the present invention is applied to optical touch control display systems for converting simulated sensor output data Vout 200, as shown in FIG. 10 and FIG. 11, detected by the position sensor 21 into a digital signal 300 to be processed by a processor 5.

FIG. 10 and FIG. 11, the analog-to-digital conversion system 100 of the present invention mainly includes a digital comparator 110 and a variable reference level generator 120. The digital comparator 110 is used to replace the conventional ADC circuit while the variable reference level generator 120 is for calculation to generate a matching variable reference level VREF according to peak value VA 300 of the sensor output data Vout 200. The peak value VA is obtained by the sensor output data Vout being detected by at least one detection circuit 130 and then is transmitted to the variable reference level generator 120. Thus the variable reference level generator 120 performs calculation according to the input reference value such as, but not limited to, the above peak value VA to generate a variable reference level VREF corresponding to the peak value VA. Due to that the reference value input into the variable reference level generator 120 such as the peak value VA is not a fixed value (the sensor output data Vout indicated by dotted line in FIG. 1A and FIG. 8A), the variable reference level VREF generated is not a fixed value. That means the variable reference level VREF changes along with the changed peak value VA. The variable reference level VREF fluctuates according to needs, as up and down arrows indicated in FIG. 10 and FIG. 11. Next the sensor output data Vout 200 and the variable reference level VREF are respectively input into the digital comparator 110. By the digital comparator 110, the sensor output data Vout 200 is converted into a digital signal 300 based on the variable reference level VREF and then the digital signal is output to the processor 5.

Figure 8:
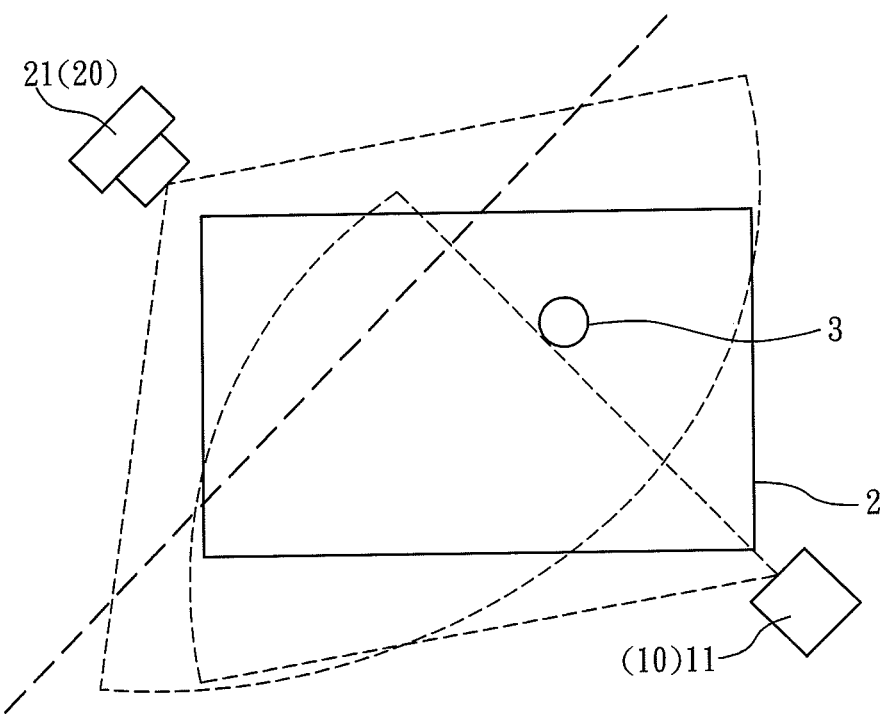
FIG. 8 is a schematic drawing showing photo interrupter type optical touch control system in use according to the present invention.
Figure 8A:
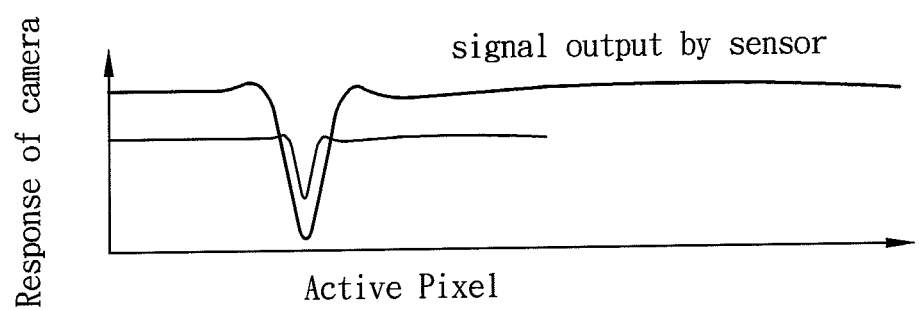
FIG. 8A is a schematic drawing showing an analog output data (Vout) sensed by active pixels of a position sensor of the embodiment in FIG. 8 according to the present invention.
Figure 12:
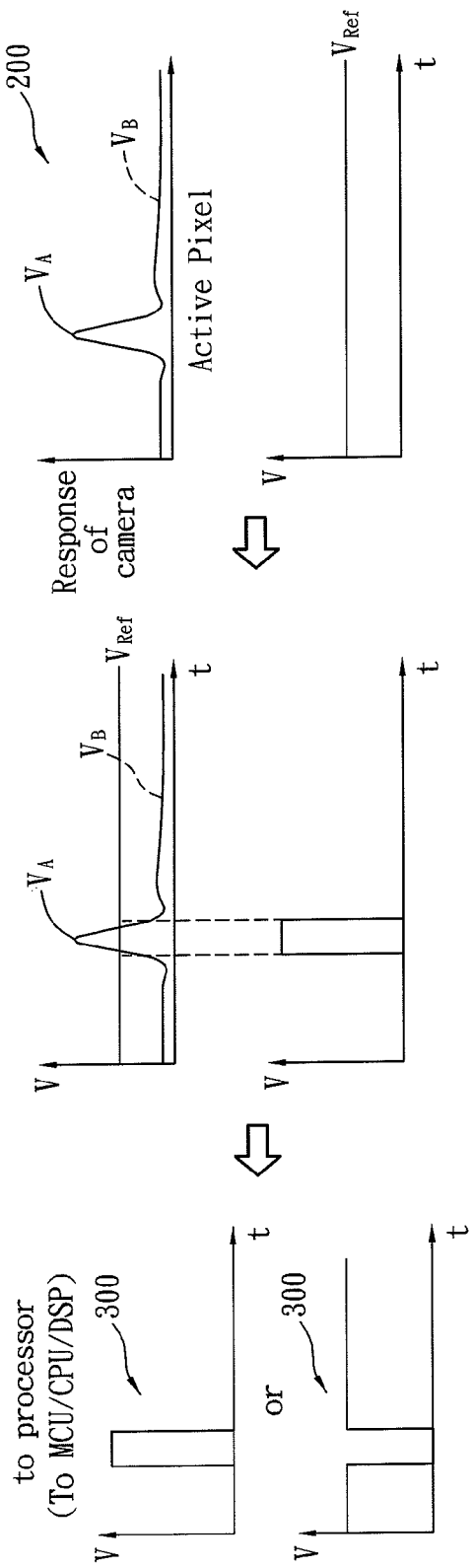
FIG. 12 is a schematic drawing showing function of a level comparator of an analog-to-digital conversion system applied to a reflective touch control system according to the present invention.
Figure 13:
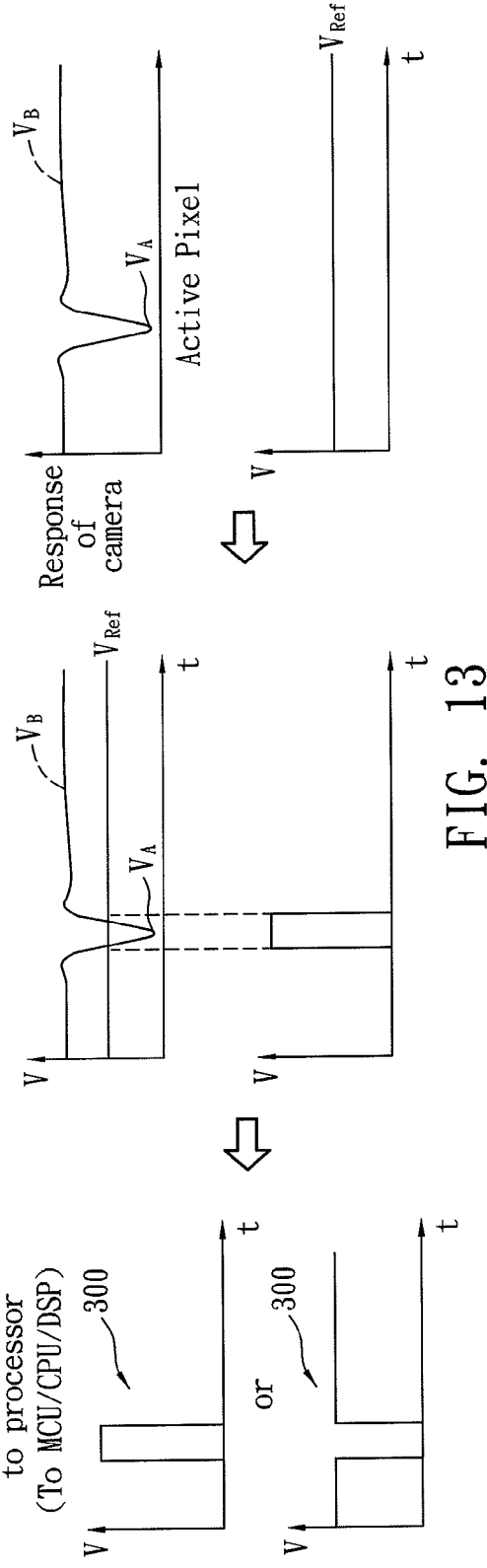
FIG. 13 is a schematic drawing showing function of a level comparator of an analog-to-digital conversion system applied to a photo interrupter type touch control system according to the present invention.

Refer to FIG. 12 and FIG. 13, the digital comparator 110 checks and compares the sensor output data Vout 200 based on the variable reference level VREF while receiving the sensor output data Vout 200 and the variable reference level VREF. The variable reference level VREF is generated along with the changed peak value VA correspondingly. That means no matter how the sensor output data Vout 200 and the peak value VA change as shown in FIG. 1A and FIG. 8A, the variable reference level VREF also changes to form a corresponding base through calculation of the variable reference level generator 120. Thus the position of the peak value VA (timing) of the sensor output data Vout 200 is shown obviously by using the matched variable reference level VREF as a comparison base, as shown in FIG. 12 and FIG. 13. Then the peak value VA is effectively and quickly converted to a digital signal 300 to be output to the processor 5. Moreover, the form of the digital signal 300 is not limited. In relative to the variable reference level VREF, the variable reference level VREF can be a positive pulse or a negative pulse, as shown in FIG. 12 and FIG. 13.

In the analog-to-digital conversion system 100 of the present invention, the variable reference level generator 120 is for generating a matching variable reference level VREF. In practice, besides the peak value VA, the variable reference level generator 120 can also calculate and generate the variable reference level VREF according to following reference values: a reference voltage level (VB), a temperature variance obtained by temperature detection (VC), a light source intensity variance obtained by detection of light source intensity (VD), an ambient light intensity variance obtained by detection of ambient light intensity (VE), or combinations of these values.

<Embodiment one>

Figure 14:
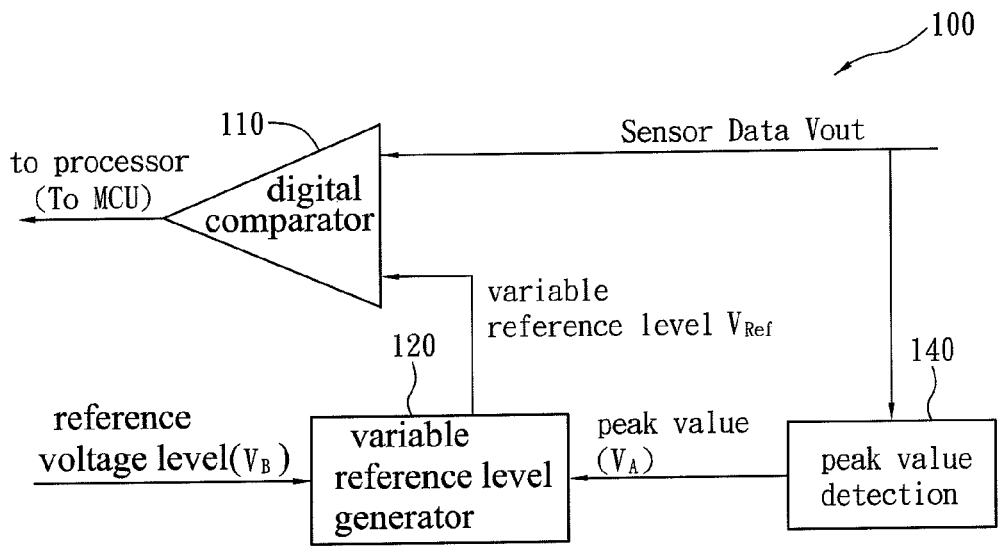
FIG. 14 is a block diagram showing structure and function of an embodiment of an analog-to-digital conversion system according to the present invention.

Refer to FIG. 14, in this embodiment, the variable reference level generator 120 calculates to generate the variable reference level VREF according to a peak value (VA)

obtained by peak value detection 140 and a reference voltage level (VB). For example, the variable reference level generator 120 is set, but not limited, to calculate VREF=(VA+VB)/2. That means the variable reference level VREF is equal to the average value of the peak value (VA) and the reference voltage level (VB). The peak value detection 140 is completed by detection circuit 130. The reference voltage level (VB) is the part of the sensor output data Vout except the peak value (VA) and is detected by the detection circuit 130, as shown in FIG. 12 and FIG. 13. Then based on the variable reference level VREF, the sensor output data Vout is processed and converted into a digital signal by the digital comparator 110 and the digital signal is output to the processor.

<Embodiment two>

Figure 15:
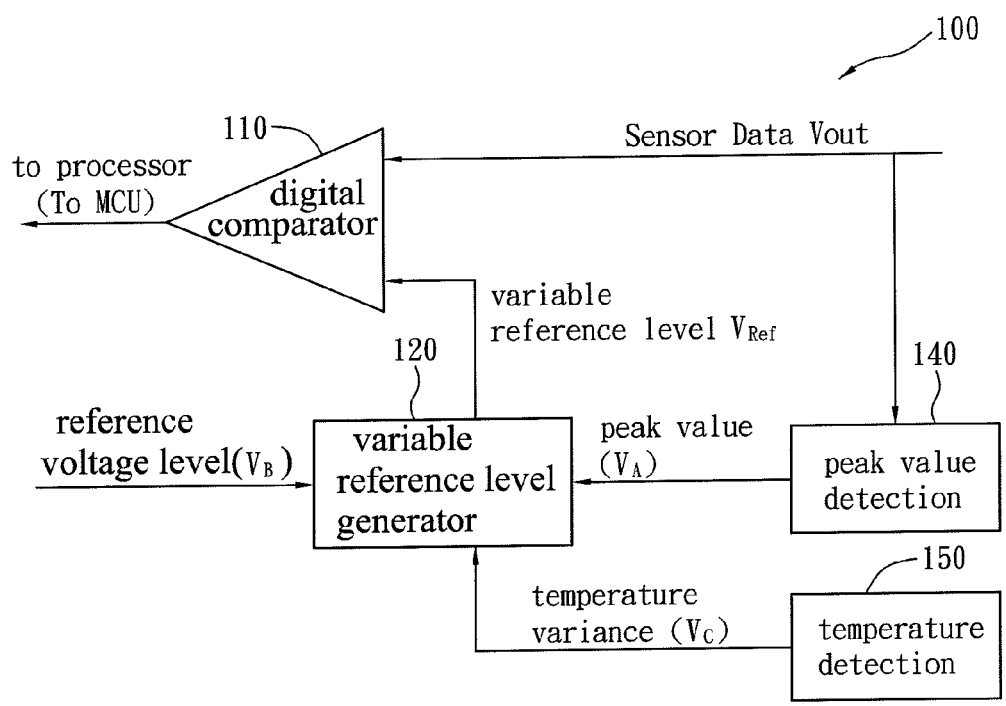
FIG. 15 is a block diagram showing structure and function of another embodiment of an analog-to-digital conversion system according to the present invention.

Refer to FIG. 15, in this embodiment, the variable reference level generator 120 calculates to generate the variable reference level VREF according to a peak value (VA) obtained by peak value detection 140, a reference voltage level (VB), and a temperature variance (VC) obtained by temperature detection 150. The peak value detection 140 and the temperature detection 150 are performed by detection circuit 130 or related detection circuit. The calculation module of the variable reference level generator 120 can be set in advance so as to make the variable reference level VREF and the sensor output data Vout have a better matching and this is beneficial to analog-to-digital conversion of the digital comparator 110. Then based on the variable reference level VREF, the sensor output data Vout is compared and converted into a digital signal by the digital comparator 110 for outputting the digital signal to a processor. Since the calculation of the variable reference level generator 120 already include the temperature variance (VC), the temperature variance (VC) is one of the parameters used to generate the variable reference level VREF. Thus the analog-to-digital conversion system 100 of this embodiment has advantages of temperature variation resistance and sensor variation resistance.

<Embodiment three>

Figure 16:
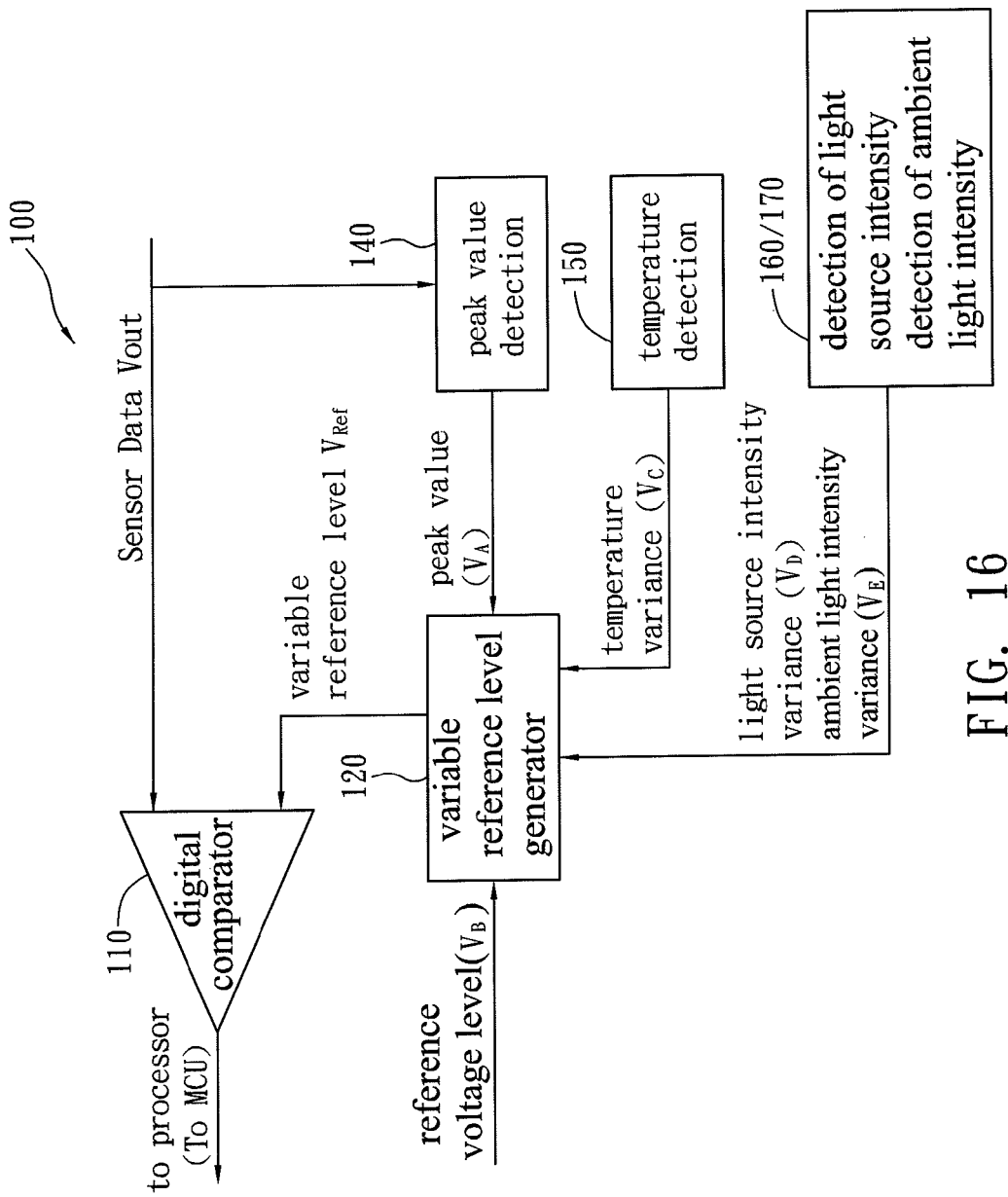
FIG. 16 is a block diagram showing structure and function of a further embodiment of an analog-to-digital conversion system according to the present invention.

Refer to FIG. 16, in this embodiment, the variable reference level generator 120 calculates to generate the variable reference level VREF according to a peak value (VA) obtained by peak value detection 140, a reference voltage level (VB), a temperature variance (VC) obtained by temperature detection 150, and a light source intensity variance (VD) obtained by detection of light source intensity 160 or VA, VB, VC and an ambient light intensity variance (VE) obtained by detection of ambient light intensity 170. The peak value detection 140, the temperature detection 150, the detection of light source intensity 160 and the detection of ambient light intensity 170 are performed by detection circuit 130 or related detection circuit. The calculation module of the variable reference level generator 120 can be set in advance so as to make the variable reference level VREF and the sensor output data Vout have a better matching and this is beneficial to analog-to-digital conversion of the digital comparator 110. Then based on the variable reference level VREF, the sensor output data Vout is compared and converted into a digital signal by the digital comparator 110 for outputting the digital signal to a processor. Since the calculation of the variable reference level generator 120 already includes the temperature variance (VC), and the light source intensity variance (VD)/the ambient light intensity variance (VE), each variance is one of the parameters used to generate the variable reference level VREF. Thus the analog-to-digital conversion system 100 of this embodiment has advantages of temperature variation resistance, sensor variation resistance, light source intensity variation resistance and/or ambient light intensity variation resistance.

<Embodiment four>

Figure 17:
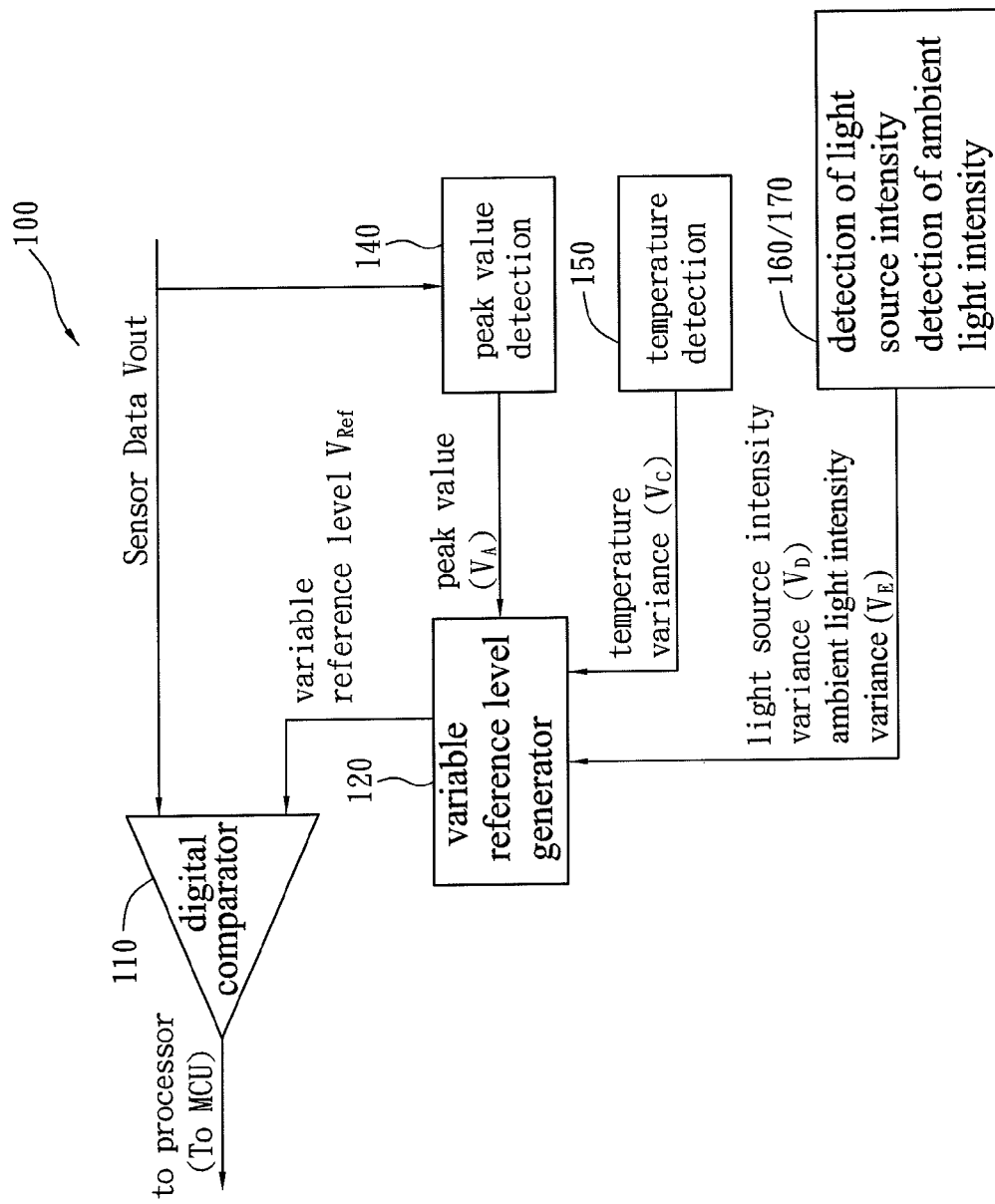
FIG. 17 is a block diagram showing structure and function of a further embodiment of an analog-to-digital conversion system according to the present invention.
Figure 18:
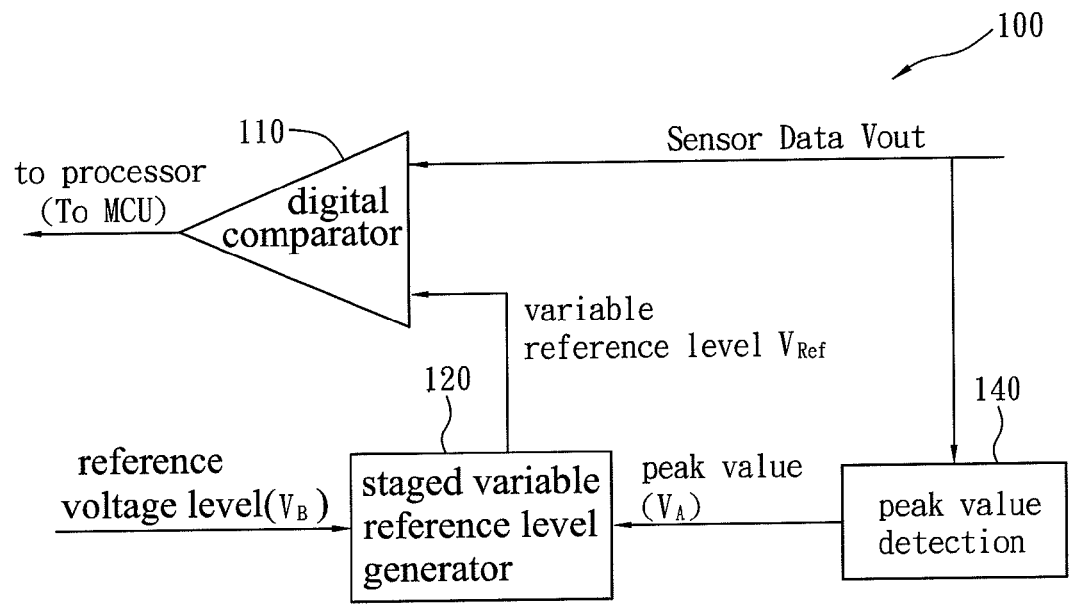
FIG. 18 is a block diagram showing structure and function of a further embodiment of an analog-to-digital conversion system according to the present invention.

Refer to FIG. 17, in this embodiment, the variable reference level generator 120 calculates to generate the variable reference level VREF according to a peak value (VA) obtained by peak value detection 140, a temperature variance (VC) obtained by temperature detection 150, and a light source intensity variance (VD) obtained by detection of light source intensity 160 or VA, VC and an ambient light intensity variance (VE) obtained by detection of ambient light intensity 170. The peak value detection 140, the temperature detection 150, the detection of light source intensity 160 and the detection of ambient light intensity 170 are performed by detection circuit 130 or related detection circuit. The calculation module of the variable reference level generator 120 can be set in advance so as to make the variable reference level VREF and the sensor output data Vout have a better matching and this is beneficial to analog-to-digital conversion of the digital comparator 110. Then based on the variable reference level VREF, the sensor output data Vout is compared and converted into a digital signal by the digital comparator 110 for outputting the digital signal to a processor.

The difference between the embodiment three and the embodiment four is in that the calculation of the variable reference level generator 120 doesn't include the reference voltage level (VB). That means the reference voltage level (VB) is not one of the parameters used for generating the variable reference level VREF.

<Embodiment five>

Refer to FIG. 12, the structure and function of this embodiment are similar to the embodiment. The difference between this embodiment and the embodiment one is in that the variable reference level VREF generated by calculation of the variable reference level generator 120 according to the peal value VA and the reference voltage level VB is a staged variable reference level. The digital comparator 110 can use a proper reference level VREF of the staged reference level as a base for converting the sensor output data Vout into a digital signal effectively and quickly and outputting the digital signal to a processor. Thereby the variable reference level VREF originally not staged or unable to be staged is changed to be a staged variable reference level. The interval between values among each stage of the reference level is increased. Thus application range of each stage of the reference level is broadened, the loading of the processor program is reduced and the program efficiency is improved.

The variable reference level generated by the variable reference level generator 120 in the embodiment one is changed with variations of each parameter without stages. For example, once there is a little change of the peak value (VA) and the reference voltage level VB, the variable reference level VREF=(VA+VB)/2 is also changed a little bit. However, the variable reference level VREF generated by the variable reference level generator 120 in this embodiment is a multi-stage reference level. That means the little change of the variable reference level VREF caused by changes of the peak value (VA) and the reference voltage level VB can be neglected intentionally. The interval between values among each stage of the reference level is increased. Thus application range of each stage of the reference level is broadened and the loading of the processor program is reduced and the program execution efficiency is improved.

Similarly, the embodiment two, the embodiment three and the embodiment four can also use the staged way of the embodiment five. The variable reference level generator 120 calculates to generate a variable reference level according a peak value VA and/or a reference vol calculates to generate a variable reference level according a peak value VA and/or a reference voltage level VB and/or each variable VC, VD, VE. The variable reference level is further set to be a staged variable reference level.

A method for operating an analog-to-digital conversion system with position/image sensor signal of the present invention comprising following steps:

providing a digital comparator 110;

detecting peak value VA of sensor output data Vout by at least one detection circuit 130;

providing a variable reference level VREF according to the peak value VA; and converting the peak value VA of the sensor output data Vout into a digital signal based on the variable reference level VREF by the digital comparator 110 and outputting the digital signal to a processor.

A variable reference level generator 120 with calculation function is provided to generate a variable reference level VREF according to the peak value VA.

Moreover, the variable reference level generator 120 can further calculate to generate the variable reference level VREF according to the peak value VA and/or a reference voltage level (VB), and/or a variance obtained by temperature detection (VC), and/or a variance obtained by detection of light source intensity (VD), and/or a variance obtained by detection of ambient light intensity (VE). That means the reference voltage level (VB), and/or the variance obtained by temperature detection (VC), and/or the variance obtained by detection of light source intensity (VD), and/or the variance obtained by detection of ambient light intensity (VE) can be calculated by the variable reference level generator 120 so as to increase the efficiency of the analog-to-digital conversion system with image sensor signal of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A laser optical touch control module disposed on one side of a display for providing optical positioning input function to form an optical touch control display contacted by a touch control widget comprising a light emitting part and a light receiving part; wherein a laser beam is emitted from a laser light source of the light emitting part and is reflected by a wide angle optical element so that a light fan of the reflected laser beam is larger than 90 degrees and a wide angle linear light beam is formed; the linear light beam is blocked to form a reflected laser beam when the touch control widget is in contact with surface of the display;

the light receiving part receives and senses the reflected laser beam by a position sensor to output a signal and get a position of the touch control widget;

wherein a light path of the light emitting part and a light path of the light receiving part share the same light path; thus the laser light source of the light emitting part and the position sensor of the light receiving part share the same wide angle optical element; the laser beam emitted from the laser light source and the reflected laser beam received and sensed by the position sensor pass the wide angle optical element;

wherein a beam splitter is disposed on rear of the wide angle optical element so as to make the laser beam emitted from the laser light source pass through the beam splitter to be emitted to the wide angle optical element while the reflected laser beam passing through the wide angle optical element and entering the beam splitter is reflected to be received and sensed by the position sensor, wherein the beam splitter is a polarization beam splitter and a quarter-wave plate is arranged between the wide angle optical element and the polarization beam splitter; thus while the laser beam emitted from the laser light source passing through the polarization beam splitter, one polarization component of the laser beam passes through while the other polarization component perpendicular to the polarization component is reflected;

wherein the polarization component passed the polarization beam splitter is converted into a left hand circular polarization or a right hand circular polarization by the quarter-wave plate; then the reflected laser beam is changed into the other circular polarization after being reflected by the touch control widget and is converted into the polarization component perpendicular to the original polarization component by the quarter-wave plate, and then entering the polarization beam splitter to be totally reflected onto the position sensor.

2. The module as claimed in claim 1, wherein the wide angle optical element is a line generator optics.

3. The module as claimed in claim 1, wherein the light emitting part and the light receiving part are mounted in a housing with an opening to form an assembly.

4. The module as claimed in claim 1, wherein a collimator is arranged between the laser light source and the beam splitter.

5. The module as claimed in claim 1, wherein the laser light source is a laser light source that emits a small-diameter laser beam; a beam expander is set between the sensing surface of the position sensor and the beam splitter.

6. An analog-to-digital conversion system for converting analog output data detected by at least one position sensor Vout into digital signals to be processed by at least one processor comprising: a digital comparator for receiving sensor output data Vout from the position sensor and a variable reference level generated by a variable reference level generator;

the variable reference level generator calculates to generate a variable reference level VREF according to a peak value VA of the sensor output data Vout and output the variable reference level to the digital comparator;

wherein the sensor output data Vout is converted to a digital signal based on the variable reference level by the digital comparator and then the digital signal is output to the processor, wherein the variable reference level generator calculates to generate the variable reference level VREF according to the peak value VA and a reference voltage level VB of the sensor output data; the reference voltage level VB is voltage level of the sensor output data Vout except the peak value VA.

7. The system as claimed in claim 6, wherein the peak value VA of the sensor output data Vout is detected by at least one detection circuit.

8. The system as claimed in claim 6, wherein the variable reference level VREF is equal to an average value of the peak value VA and the reference voltage level VB.

9. The system as claimed in claim 6, wherein the variable reference level VREF is set into a staged variable reference level.

10. An analog-to-digital conversion method that effectively converts analog output data Vout into digital signals to be processed by a processor based on the analog-to-digital conversion system of the claim 6 comprising the steps of:
providing a digital comparator;
detecting peak value VA of sensor output data Vout by at least one detection circuit;
providing a variable reference level VREF according to the sensor output data Vout and the peak value VA; and
converting the peak value VA of the sensor output data Vout into a digital signal based on the variable reference level VREF by the digital comparator and outputting the digital signal,
wherein the variable reference level generator that calculates to generate a variable reference level according to the peak value VA is further provided,
wherein the variable reference level generator calculates to generate the variable reference level VREF according to the peak value VA of the sensor output data Vout, the reference voltage level VB, a temperature variance VC, a light source intensity variance VD, an ambient light intensity variance VE or their combinations; wherein the reference voltage level VB is voltage level of the sensor output data Vout except the peak value VA; the temperature variance VC is obtained by temperature detection; the light source intensity variance VD is obtained by detection of light source intensity; the ambient light intensity variance VE is obtained by detection of ambient light intensity.

11. The method as claimed in claim 10, wherein the variable reference level VREF generated by calculation of the variable reference level generator is set into a staged variable reference level.

12. An analog-to-digital conversion system for converting analog output data detected by at least one position sensor Vout into digital signals to be processed by at least one processor comprising: a digital comparator for receiving sensor output data Vout from the position sensor and a variable reference level generated by a variable reference level generator;

the variable reference level generator calculates to generate a variable reference level VREF according to a peak value VA of the sensor output data Vout and output the variable reference level to the digital comparator;

wherein the sensor output data Vout is converted to a digital signal based on the variable reference level by the digital comparator and then the digital signal is output to the processor; and wherein the variable reference level generator calculates to generate the variable reference level VREF according to the peak value VA of the sensor output data Vout, the reference voltage level VB, a temperature variance VC, a light source intensity variance VD, an ambient light intensity variance VE or their combinations; wherein the reference voltage level VB is voltage level of the sensor output data Vout except the peak value VA; the temperature variance VC is obtained by temperature detection; the light source intensity variance VD is obtained by detection of light source intensity; the ambient light intensity variance VE is obtained by detection of ambient light intensity.

13. The system as claimed in claim 12, wherein the peak value VA of the sensor output data Vout is detected by at least one detection circuit.

14. The system as claimed in claim 12, wherein the variable reference level VREF is set into a staged variable reference level.

* * * * *